(12) United States Patent
Lin

(10) Patent No.: US 11,891,695 B2
(45) Date of Patent: Feb. 6, 2024

(54) VIBRATING DEPOSITION DEVICE

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 210 days.

(21) Appl. No.: 17/696,496

(22) Filed: Mar. 16, 2022

(65) Prior Publication Data

US 2023/0295802 A1 Sep. 21, 2023

(51) Int. Cl.
*C23C 16/455* (2006.01)
*C23C 16/44* (2006.01)

(52) U.S. Cl.
CPC .... *C23C 16/45544* (2013.01); *C23C 16/4417* (2013.01)

(58) Field of Classification Search
CPC ...................... C23C 16/4417; C23C 16/45544
See application file for complete search history.

(56) References Cited

U.S. PATENT DOCUMENTS

| | | | | |
|---|---|---|---|---|
| 6,149,785 A * | 11/2000 | Makowiecki | ............. | B22F 1/18 204/298.26 |
| 6,241,858 B1 * | 6/2001 | Phillips | .................. | C23C 14/50 428/404 |
| 6,524,381 B1 * | 2/2003 | Phillips | ................. | C09C 1/0015 428/363 |
| 11,185,139 B1 * | 11/2021 | Tong | ................. | C23C 16/45555 |
| 2006/0172065 A1 * | 8/2006 | Carlotto | .................... | B01J 2/006 118/726 |
| 2011/0003088 A1 * | 1/2011 | Honda | ....................... | B01J 2/12 118/723 E |
| 2020/0385860 A1 * | 12/2020 | Hirose | ....................... | B22F 1/16 |
| 2021/0156025 A1 * | 5/2021 | Wakabayashi | .......... | H01F 41/00 |
| 2022/0106682 A1 * | 4/2022 | Lin | ..................... | C23C 16/4557 |
| 2022/0106684 A1 * | 4/2022 | Lin | ..................... | C23C 16/4557 |
| 2022/0106685 A1 * | 4/2022 | Lin | ...................... | C23C 16/403 |
| 2022/0106686 A1 * | 4/2022 | Lin | ..................... | C23C 16/4557 |
| 2022/0136103 A1 * | 5/2022 | Lin | .................. | C23C 16/45544 118/719 |
| 2022/0162750 A1 * | 5/2022 | Lin | ..................... | C23C 16/4417 |
| 2022/0341036 A1 * | 10/2022 | Lin | .................. | C23C 16/45525 |
| 2023/0120393 A1 * | 4/2023 | Lin | ..................... | C23C 16/4417 118/715 |

\* cited by examiner

*Primary Examiner* — Benjamin Kendall
(74) *Attorney, Agent, or Firm* — Chun-Ming Shih; HDLS IPR SERVICES

(57) ABSTRACT

The invention provides a vibrating deposition device, which includes a vacuum chamber, a fixed rod and a powder tank. The vacuum chamber includes an inner side surface, and a plurality of bulges and notches are arranged on the inner side surface. The fixed rod and the powder tank are arranged in an accommodating space of the vacuum chamber, wherein the powder tank is used for accommodating powders and contacts the inner side surface of the vacuum chamber through a protruding unit. When the vacuum chamber rotates, the protruding unit will be displaced between the bulge and the notch, and the powder tank will be displaced up and down relative to the vacuum chamber to vibrate powders in the powder tank, so that a uniform film will be formed on the surface of powders.

20 Claims, 5 Drawing Sheets

VIBRATING DEPOSITION DEVICE

FIELD OF THE INVENTION

The present invention relates to a vibrating deposition device, which is able to vibrate powders during deposition, so as to form a thin film with uniform thickness on powders.

BACKGROUND

Nanoparticle is defined as a particle smaller than 100 nanometer (nm) in at least one dimension, which shows different physical and chemical properties comparing with that in macroscopic scale. Generally, macroscopic matters have all the same physical property, no matter what size they are, however neither do the nanoparticle. The nanoparticles hold useful potentials in technic fields of biomedicine, optics and electronics, etc.

Quantum dots are semiconductor nanoparticles. Nowadays, II-VI semiconductor materials, such as zinc sulfide (ZnS), cadmium sulfide (CdS) and cadmium selenide (CdSe), are under research, especially the CdSe. A common size of the QD is between 2 nm and 50 nm. When the QD is exposed to ultraviolet (UV) light, electrons of the QD absorb energy from the UV light and jump from valence band to conductance band. Then, the excited electron can drop back into the valence band releasing its energy by the emission of light.

The QD possesses a band gap which is size-concerned, when size of the QD is larger, the band gap is smaller as so to emit light with longer wavelength. When the size of the QD is smaller, the band gap is larger as so to emit light with shorter wavelength. For example, QD with a size of 5 nm-6 nm emits orange or red light, while QD with a size of 2 nm-3 nm emits blue or green light. Further, the light color may also depend on the material composition of the QD.

A light-emitting diode employing QD can generate light with proximately continuous spectrum, and high color-rendering index (CRI), which improves a quality of light emission. Also, the wavelength of the emitted light can be adjusted via changing size of the QD. Therefore, the QD are significant for development of new-generation lighting devices and displays.

Despite of such advantages and features, the QDs may have agglomeration problem occurred often in manufacturing process thereof. Moreover, QDs have high surface activity, which may easily react with air and water vapor and shorten a lifetime of the QD.

To be specific, in a process of encapsulating QDs by gel to construct light-emitting diode (LED), agglomeration may occur to disrupt optical performance of the QDs. Also, after gel-encapsulating the QDs for constructing the LED, environmental oxygen or water vapor may sneak through the gel layer and contact surfaces of the QDs, which causes oxidation of the QDs and hence shorten the lifetime of the QDs so as the LED. Moreover, defects and dangling bonds on the surfaces of the QDs may cause non-radiative recombination problem, which reduces the luminous efficiency of quantum dots.

Currently, a nanometer-thick film or multiple layers of thin film, such as quantum well structure, is formed on the surface of the QD by atomic layer deposition (ALD) process thereon.

Atomic layer deposition is suitable to form a thin film with a uniform thickness on a substrate, and should be suitable for three-dimensional QD in theory. However, when QDs are placed on the carrier plate, some adjacent QDs may tightly contact each other and hence there is no space therebetween. Thus, a precursor gas used in the ALD process is unable to contact all surfaces of the QDs to form complete and evenly-distributed thin films on all of the QDs.

SUMMARY

In order to overcome the above-mentioned problems of the prior art, the present invention provides a vibrating deposition device, which can vibrate powders during the atomic layer deposition process to form a film with uniform thickness on the surface of powders.

It is an object of the present invention to provide a vibrating deposition device, which mainly includes a vacuum chamber, a fixed rod, and a powder tank. The fixed rod and the powder tank are located within a reaction space of the vacuum chamber. The powder tank is connected to the fixed rod, and the powder tank and the fixed rod will not rotate with the vacuum chamber.

The vacuum chamber comprises at least on inner side surface and two bases to form the reaction space that may be a cylinder. The inner side surface of the vacuum chamber is provided with a plurality of bulges and a plurality of notches, and the powder tank contacts the inner side surface of the vacuum chamber. When the vacuum chamber rotates relative to the powder tank and the fixed rod, the powder tank will move up and down with the bulges and the notches to vibrate powders in the powder tank and form the film with uniform thickness on the surface of powders. In another embodiment, the reaction space of the vacuum chamber may be a polygonal cylinder. When the vacuum chamber rotates relative to the powder tank and the fixed rod, the powder tank will also move up and down relative to the vacuum chamber.

In practical application, the powder tank includes at least one arc-shaped corner or at least one protruding unit, and contacts the inner side surface of the vacuum chamber via the arc-shaped corner or the protruding unit. Thus, the powder tank is able to move up and down relative to the vacuum chamber.

It is an object of the present invention to provide a vibrating deposition device, wherein the powder tank is connected to the fixed rod through a connecting bracket. A movable mechanism is provided between the connecting bracket and the powder tank, so that the powder tank can be displaced relative to the connecting bracket and the fixed rod. For example, the powder tank may be displaced along a radial direction of the vacuum chamber to vibrate powders in the powder tank.

In practical application, the number, height, width of the bulges and/or rotation speed of the vacuum chamber may be changed according to the material, size, shape of the powder, the type of precursor, the size of the powder tank and/or the pressure, the size of the vacuum chamber to adjust the vibration frequency and amplitude of the powder tank.

The present invention provides a vibrating deposition device, comprising: a vacuum chamber comprising an inner side surface, a first base and a second base, wherein the first base and the second base are respectively disposed two sides of the inner side surface forming a reaction space, wherein the inner side surface is provided with a plurality of bulges and a plurality of notches; a fixed rod located in the reaction space of the vacuum chamber, wherein the vacuum chamber is rotatable relative to the fixed rod; a powder tank located in the reaction space of the vacuum chamber, and comprising: a box body for accommodating powders, and connected to the fixed rod through a connecting bracket; and at least one protruding unit located on an outer surface of the box body, and contacting the inner side surface of the vacuum chamber, wherein when the vacuum chamber rotates relative to the fixed rod and the powder tank, the protruding unit displaces between the bulge and the notch, so that the powder tank is displaced up and down relative to the vacuum chamber to vibrate the powders in the box body.

The present invention provides a vibrating deposition device, comprising: a vacuum chamber comprising an inner side surface, a first base and a second base, wherein the first base and the second base are respectively disposed two sides of the inner side surface forming a reaction space; a fixed rod located in the of the reaction space of the vacuum chamber, wherein the vacuum chamber is rotatable relative to the fixed rod; a powder tank located in the reaction space of the vacuum chamber, and comprising: a box body for accommodating powders, and connected to the fixed rod through a connecting bracket; and at least one rotating wheel connected to the box body, and at least one bulge arranged on a surface of the rotating wheel, wherein the rotating wheel contacts the inner side surface of the vacuum chamber, when the vacuum chamber rotates relative to the fixed rod, the rotating wheel will rotate relative to the box body and the inner side surface of the vacuum chamber, so that the powder tank will be displaced up and down relative to the vacuum chamber to vibrate the powders in the box body.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 1:
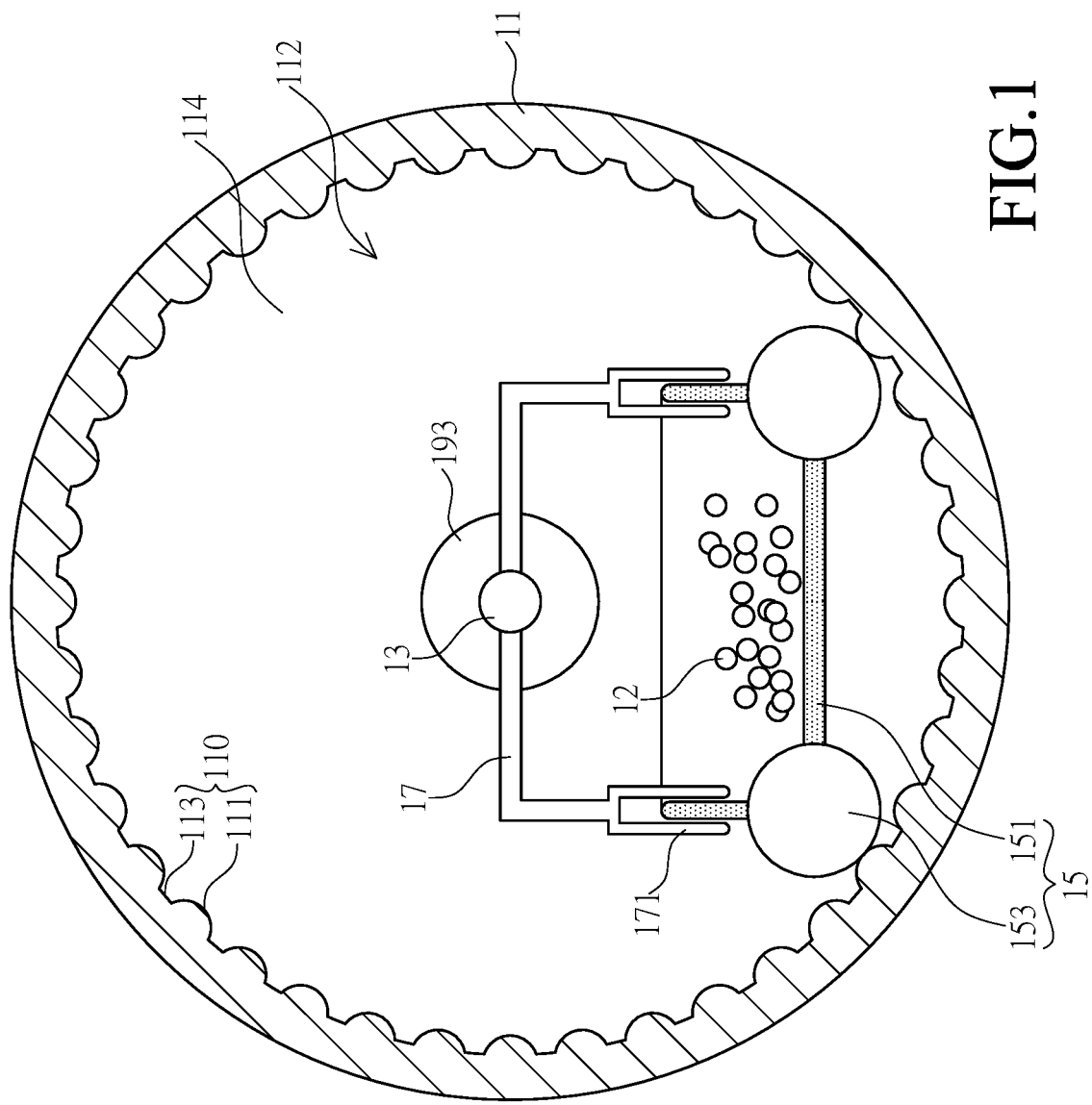
FIG. 1 is a schematic cross-sectional view of a vibrating deposition device according to an embodiment of the invention.
Figure 2:
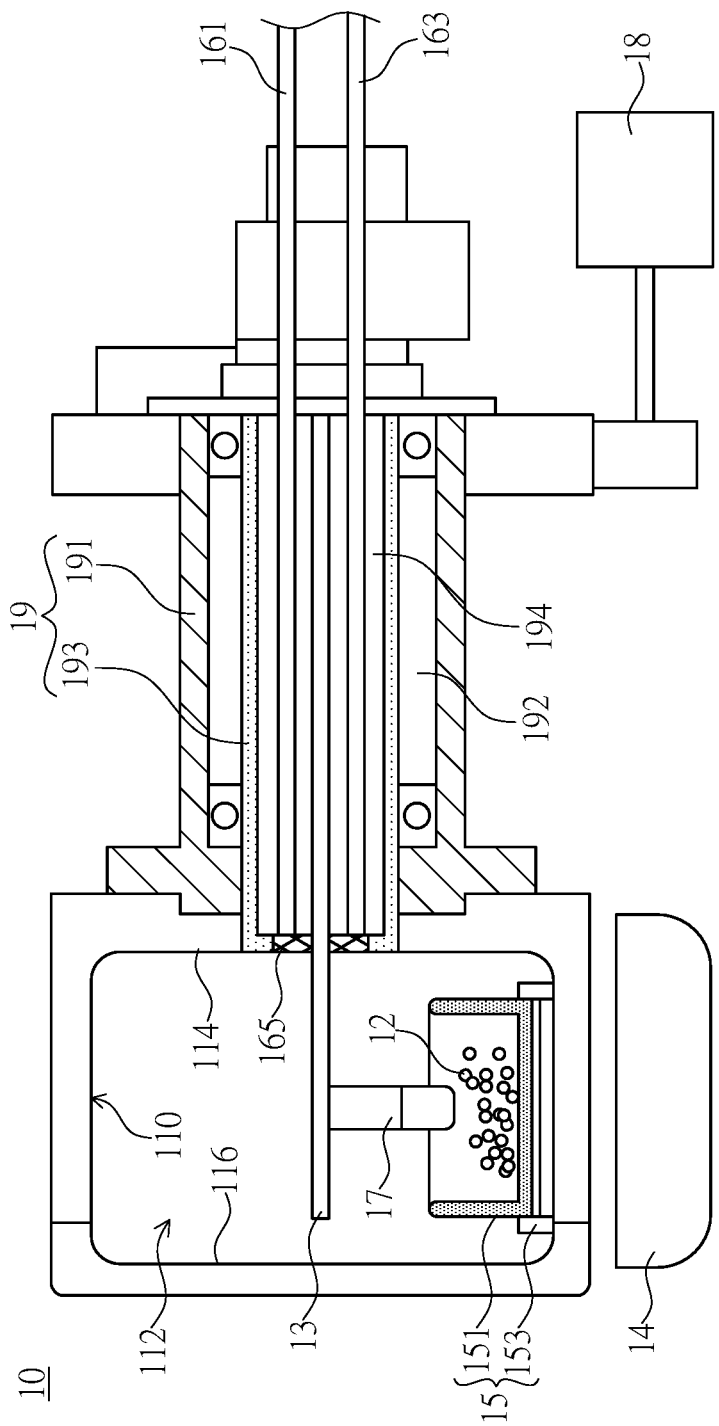
FIG. 2 is a schematic longitudinal cross-sectional view of the vibrating deposition device according to another embodiment of the invention.

FIG. 1 is a schematic cross-sectional view of a vibrating deposition device according to an embodiment of the invention. FIG. 2 is a schematic longitudinal cross-sectional view of the vibrating deposition device according to another embodiment of the invention. The vibrating deposition device 10 includes a vacuum chamber 11, a fixed rod 13 and a powder tank 15, wherein the vacuum chamber 11 has a reaction space 112 for containing the fixed rod 13 and the powder tank 15.

The vacuum chamber 11 includes at least one inner side surface 110, a first base 114 and a second base 116. The inner side surface 110 may be tubular, the first base 114 and the second base 116 may be a circle or a regular polygon, and respectively disposed on two sides of the inner side surface 110. For example, the first base 114 and the second base 116 are parallel to each other, and the first base 114, the second base 116 and the inner side surface 110 form a cylinder reaction space 112 or a polygonal cylindrical reaction space 112.

A plurality of bulges 111 are disposed on the inner side surface 110, and a notch 113 is formed between two adjacent bulges 111. The bulge 111 and the notch 113 are sequentially arranged on the inner side surface 110 of the vacuum chamber 11.

In one embodiment of the invention, the bulge 111 may be an elongated bulge, such as a semicircular cylinder or a polygonal cylinder, and the bulges 111 may be parallel to the axial direction of the vacuum chamber 11. Alternatively, there is an included angle between the bulges 111 and the axial direction of the vacuum chamber 11.

The vacuum chamber 11 is rotatable relative to the fixed rod 13. For example, the fixed rod 13 is connected to the first base 114 of the vacuum chamber 11 through a bearing. Thus, when the vacuum chamber 11 rotates, the fixed rod 13 will remain stationary. The detailed connection structure between the vacuum chamber 11 and the fixed rod 13 will be described in the following embodiments.

The powder tank 15 includes a box body 151 and at least one protruding unit 153, wherein the box body 151 is used to contain powders 12, and the protruding unit 153 is arranged on the outer surface of the box body 151. The box body 151 is connected to the fixed rod 13 via a connecting bracket 17. When the vacuum chamber 11 rotates relative to the fixed rod 13, the box body 151 will not rotate with the vacuum chamber 11. The powders 12 placed in the box body 151 may be quantum dots, such as ZnS, CdS, CdSe and other II-VI semiconductor materials, and the film formed on the quantum dots may be aluminum oxide (Al2O3).

Specifically, the protruding unit 153 disposed on the outer surface of the box body 151 contacts the inner side surface 110 of the vacuum chamber 11. When the vacuum chamber 11 rotates, the bulges 111 and the notches 113 on the inner side surface 110 will move relative to the protruding unit 153 of the box body 151. Thus, the powder tank 15 will be displaced up and down relative to the vacuum chamber 11 to vibrate the powders 12 placed in the box body 151.

In one embodiment of the invention, the powder tank 15 is connected to the fixed rod 13 via a connecting bracket 17. A movable mechanism 171 may be provided between the connecting bracket 17 and the box body 151 of the powder tank 15, and thus the box body 151 is able to move up and down relative to the vacuum chamber 11, the connecting bracket 17 and/or the fixed rod 13. For example, the movable mechanism 171 may be a spring, an elastic member or a telescopic rod.

As shown in FIG. 1, the protruding unit 153 may be a wheel or an arc-shaped corner on the box body 151, wherein the wheel may be fixed on the box body 151, and cannot rotate relative to the box body 151. In another embodiment of the invention, the protruding unit 153 may be a rotating wheel, and is rotatable relative to the box body 151 to reduce particles generated by friction between the powder tank 15 and the inner side surface 110 of the vacuum chamber 11.

As shown in FIG. 2, the vacuum chamber 11 is connected to a shaft sealing device 19, such as a magnetic fluid shaft seal. The shaft sealing device 19 may include an outer tube 191 and an inner tube 193. The outer tube 191 has an accommodation space 192, and the inner tube 193 has a connection space 194. For example, the outer tube 191 and the inner tube 193 may be hollow cylinders. The accommodation space 192 of the outer tube 191 is used for accommodating the inner tube 193, and the outer tube 191 and the inner tube 193 are coaxial.

A motor 18 is connected to the shaft sealing device 19, and drives the vacuum chamber 11 to rotate through the shaft sealing device 19. For example, the motor 18 is connected to and drives the vacuum chamber 11 to rotate relative to the inner tube 193, the fixed rod 13 and the powder tank 15 through the outer tube 191. When the motor 18 drives the outer tube 191 and the vacuum chamber 11 rotating, the inner tube 193 will remain stationary, and the fixed rod 13 may be fixed on the inner tube 193.

The motor 18 may drive the outer tube 191 and the vacuum chamber 11 to continuously rotate in the same direction, such as clockwise or counterclockwise. In another embodiment, the motor 18 may drive the outer tube 191 and the vacuum chamber 11 to rotate clockwise direction by a specific angle, and then rotate counterclockwise direction by the specific angle. For example, the specific angle may be 360 degrees.

In one embodiment of the invention, at least one exhaust line 161 and at least one intake line 163 may be disposed in the connection space 194 of the inner tube 193, wherein the exhaust line 161 and the intake line 163 are fluidly connected to the reaction space 112 of the vacuum chamber 11. For example, the exhaust line 161 and the intake line 163 may be connected to the reaction space 112 through a filter 165. The exhaust line 161 is used for extracting the gas in the reaction space 112, so that the reaction space 112 is in a low pressure state. The intake line 163 is used for delivering at least one precursor, a carrier gas, or a cleaning gas to the reaction space 112 for forming a thin film on the surface of the powders 12 within the box body 151.

As shown in FIG. 2, a heater 14 is located outside the vacuum chamber 11, and is arranged around or partially around the inner side surface 110 of the vacuum chamber 11 for heating the powder tank 15 and the powders 12 within the vacuum chamber 11. For example, the heater 14 may be a heating coil, a microwave heater or an electromagnetic heater, and is disposed below the vacuum chamber 11 and adjacent to the powder tank 15. The box body 151 may be made of materials with high thermal conductivity, such as metal, ceramic or graphite.

In another embodiment, the heater 14 may be a heating lamp, and is adjacent to the second base 116 of the vacuum chamber 11, wherein the second base 116 of the vacuum chamber 11 may be made of light-transmitting material, such as quartz. Thus, the heater (heating lamp) 14 is able to heat the powder tank 15 and the powders 12 within the vacuum chamber 11 via the second base 116. In addition, the inner side surface 110 and the first base 114 may be surfaces with reflective properties, such as polished metal surfaces or a reflective layer formed on the inner side surface 110 and the first base 114, so that the inner side surface 110 and the first base 114 is able to reflect the light entering the reaction space 112 via the second base 116, and it is beneficial for the heating lamp to heat the powder tank 15 and the powders 12 in the reaction space 112.

Figure 3:
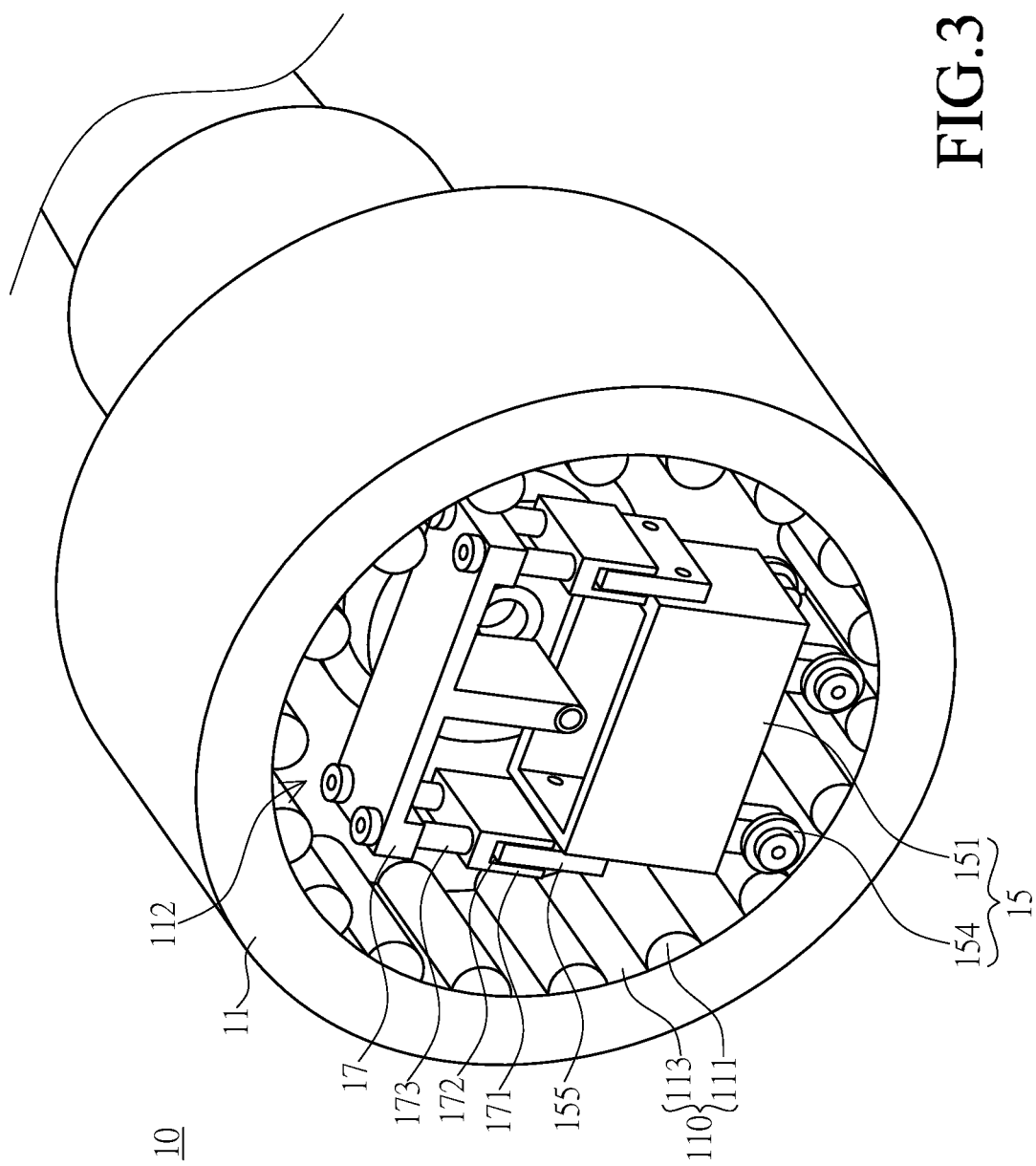
FIG. 3 is a perspective view of the vibrating deposition device according to another embodiment of the invention.

FIG. 3 is a perspective view of the vibrating deposition device according to another embodiment of the invention. The powder tank 15 includes a box body 151, at least one wheel 154 and at least one connecting unit 155. The powder tank 15 may comprise two connecting units 155 that are respectively arranged on two opposite sides of the box body 151. The wheel 154 is arranged on the bottom surface of the box body 151 and is rotatable relative to the box body 151. For example, the connecting unit 155 may be the side wall of the box body 151 or a plate protruding from the side wall of the box body 151.

The connecting bracket 17 is disposed on the fixed rod 13, and is connected to the connecting unit 155 of the box body 151 via a movable mechanism 171. The movable mechanism 171 may be a U-shaped structure, and includes a groove 172. The connecting unit 155 is inserted into the groove 172, and is able to displace along the groove 172 to be as a telescopic member. Thus, the box body 151 connected to the connecting unit 155 can be displaced up and down relative to the connecting bracket 17 and/or the fixed rod 13.

In one embodiment of the invention, a spring may be provided in the groove 172, and connected to the box body 151 or the connecting unit 155. When the protruding unit 153 contacts the bulge 111 of the vacuum chamber 11, the box body 151 will be displaced toward the inner side of the groove 172 and compresses the spring. When the protruding unit 153 enters the notch 113 of the vacuum chamber 11, the spring will extend.

In practical application, the powder tank 15 and powders 12 can be taken out from the reaction space 112 together along the axial direction of the vacuum chamber 11, and then another powder tank 15 containing powders 12 will be placed in the reaction space 112 together along the axial direction of the vacuum chamber 11. It is unnecessary to disassemble entire vacuum chamber 11 during the process of replacing the powders 12 and/or the powder tank 15 for improving the efficiency and convenience of the process.

The vibration frequency of the powder tank 15 can be adjusted by the number, distance of bulges 111 and/or the rotation speed of the vacuum chamber 11, etc. In addition, the vibration amplitude of the powder tank 15 can be adjusted by the height of the bulges 111.

In one embodiment of the invention, the connecting bracket 17 may be connected to the movable mechanism 171 via at least one length adjustment unit 173 for adjusting the distance between the inner side surfaces 110 of the vacuum chamber 11 and the movable mechanism 171. Thus, the powder tank 15 with different heights may be connected to the connecting bracket 17 via the movable mechanism 171. For example, the length adjustment unit 173 may be a screw rod, and the height of the movable mechanism 171 can be adjusted by rotating the screw rod relative to the connecting bracket 17.

Figure 4:
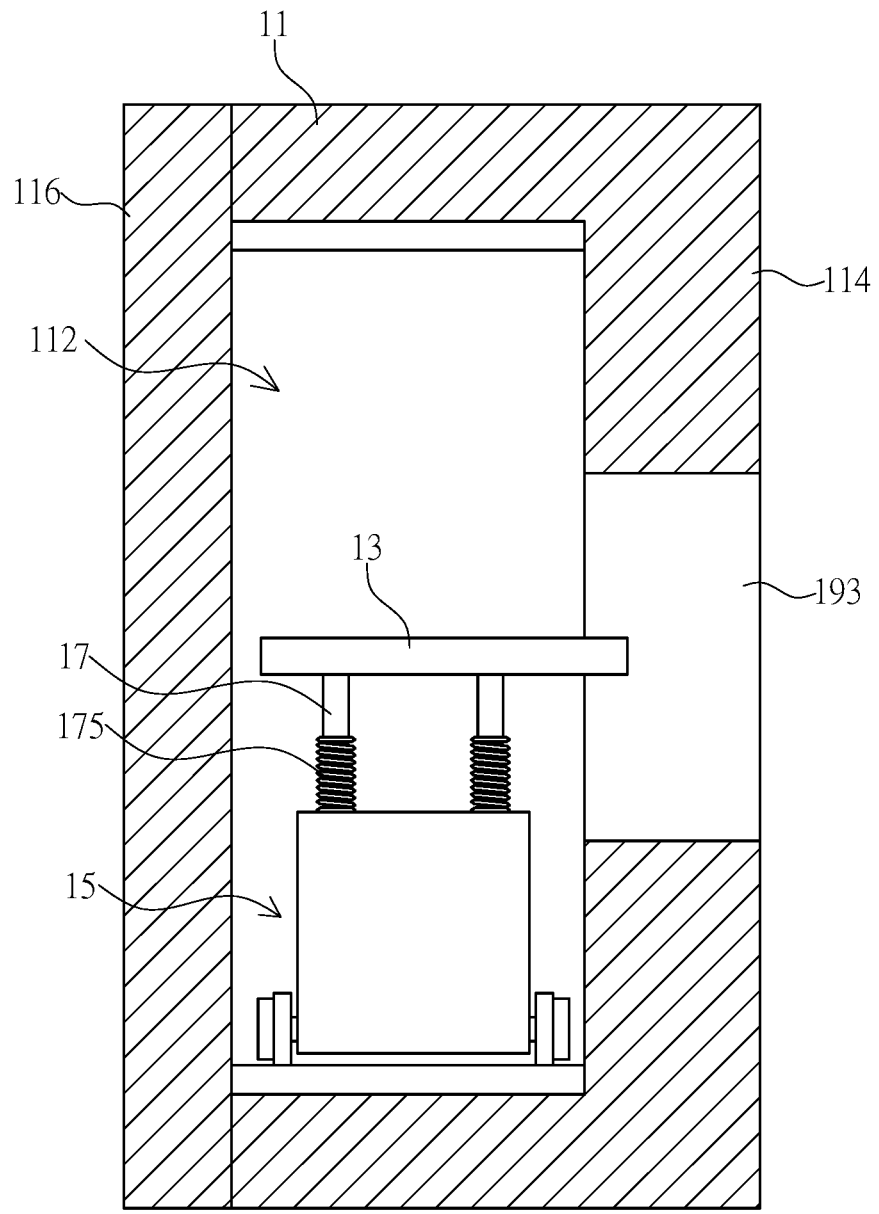
FIG. 4 is a schematic longitudinal cross-sectional view of the vibrating deposition device according to another embodiment of the invention.

As shown in FIG. 4, the movable mechanism 171 may be a spring 175, wherein the connecting bracket 17 is connected to the powder tank 15 via the spring 175, so that the powder tank 15 can be move up and down relative to the vacuum chamber 11, the connecting bracket 17 and/or the fixed rod 13 to vibrate the powders 12 in the powder tank 15.

In practical application, the powder tank 15, the connecting bracket 17, the spring 175 and/or the fixed rod 13 can be taken out from the reaction space 112 together along the axial direction of the vacuum chamber 11. Thereafter, another powder tank 15, another connecting bracket 17, another spring 175 and/or another fixed rod 13 can be placed into the reaction space 112 together. For example, a groove may be provided on the surface of the inner tube 193 facing the reaction space 112, and the fixed rod 13 can be inserted into the groove on the inner tube 193 to dispose and align the powder tank 15, the fixed bracket 17, the spring 175 and/or the fixed rod 13 in the vacuum chamber 11.

Figure 5:
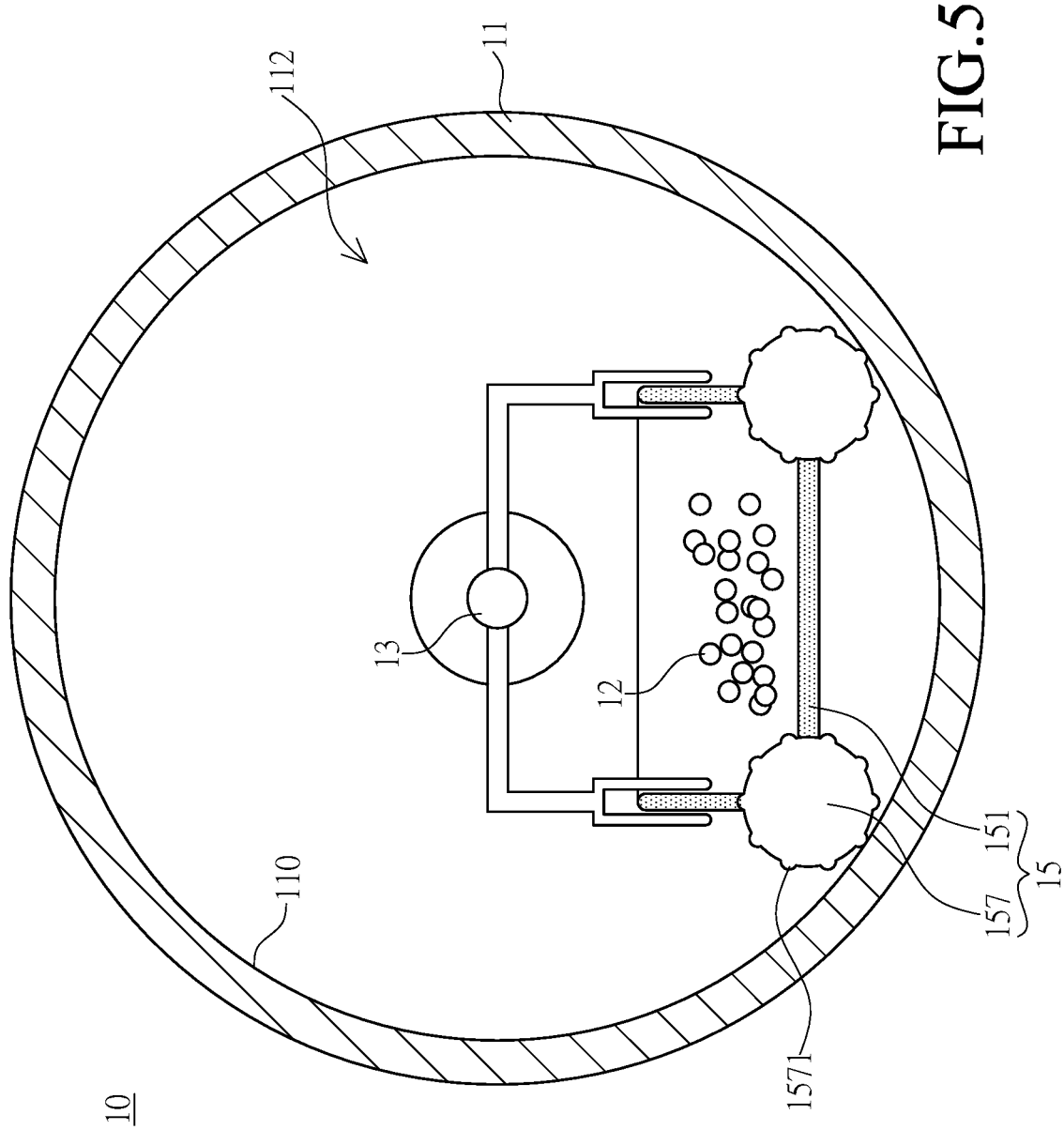
FIG. 5 is a schematic cross-sectional view of the vibrating deposition device according to another embodiment of the invention.

FIG. 5 is a schematic cross-sectional view of the vibrating deposition device according to another embodiment of the invention. The vibrating deposition device 10 mainly includes a vacuum chamber 11, a fixed rod 13 and a powder tank 15, wherein the vacuum chamber 11 has a reaction space 112 for containing the fixed rod 13 and the powder tank 15.

The inner side surface 110 of the vacuum chamber 11 of this embodiment is not provided with bulges 111 and/or notches 113. For example, the inner side surface 110 of the vacuum chamber 11 is a smooth arc surface. The powder tank 15 includes a box body 151 and a rotating wheel 157, wherein the surface of the rotating wheel 157 is provided with at least one bulge 1571. In another embodiment, the section of the rotating wheel 157 may be a polygon. The box body 151 is connected to the rotating wheel 157, and the rotating wheel 157 contacts the inner side surface 110 of the vacuum chamber 11. When the vacuum chamber 11 rotates, the box body 151 will not rotate with the vacuum chamber 11, and the rotating wheel 157 will rotate relative to the box body 151 and the inner side surface 110 of the vacuum chamber 11. Thus, the powder tank 15 is displaced up and down relative to the vacuum chamber 11 to vibrate the powders 12 in the box body 151.

In addition, the inner side surface 110 may be a rough surface. For example, a concave-convex pattern is arranged on the inner side surface 110 to increase the friction between the inner side surface 110 and the rotating wheel 157, and it is beneficial to drive the rotating wheel 157 rotating relative to the inner side surface 110 and the box body 151.

The above disclosures are only the preferred embodiments of the present invention, and are not to be used to limit the scope of the present invention. All equivalent variations and modifications on the basis of shapes, structures, features and spirits described in claims of the present invention should be included in the claims of the present invention.

The invention claimed is:

1. A vibrating deposition device, comprising:
 a vacuum chamber comprising an inner side surface, a first base and a second base, wherein the first base and the second base are respectively disposed two sides of the inner side surface forming a reaction space, wherein the inner side surface is provided with a plurality of bulges and a plurality of notches;
 a fixed rod located in the reaction space of the vacuum chamber, wherein the vacuum chamber is rotatable relative to the fixed rod;
 a powder tank located in the reaction space of the vacuum chamber, and comprising:
  a box body for accommodating powders, and connected to the fixed rod through a connecting bracket; and
  at least one protruding unit located on an outer surface of the box body, and contacting the inner side surface of the vacuum chamber, wherein when the vacuum chamber rotates relative to the fixed rod and the powder tank, the bulges and the notches on the inner side surface will move relative to the protruding unit of the box body, so that the powder tank is displaced up and down relative to the vacuum chamber to vibrate the powders in the box body.

2. The vibrating deposition device according to claim 1, further comprising a shaft sealing device including an outer tube and an inner tube, wherein the outer tube has an accommodation space for accommodating the inner tube, wherein the outer tube is connected to the vacuum chamber, and the inner tube is connected to the fixed rod.

3. The vibrating deposition device according to claim 2, further comprising a motor connecting to and driving the vacuum chamber to rotate relative to the inner tube, the fixed rod and the powder tank through the outer tube of the shaft sealing device.

4. The vibratory deposition device according to claim 2, further comprising:
 an intake line located within the inner tube, and fluidly connected to the reaction space of the vacuum chamber for delivering a precursor to the reaction space; and
 an extraction line located within the inner tube, and fluidly connected to the reaction space of the vacuum chamber for extracting a gas in the reaction space.

5. The vibration deposition device according to claim 2, wherein the shaft sealing device is connected to the first base, and the second base is made of a light-transmitting material.

6. The vibration deposition device according to claim 5, further comprising a heating lamp adjacent to the second base to heat the powder tank and the powders within the reaction space of the vacuum chamber via the second base, wherein the inner side surface and the first base are used to reflect a light from the heating lamp entering the reaction space through the second base.

7. The vibration deposition apparatus according to claim 1, further comprising a heater located outside the vacuum chamber, adjacent to a part of the inner side surface of the vacuum chamber to heat the powder tank and the powders within the reaction space of the vacuum chamber.

8. The vibrating deposition device according to claim 1, wherein the connecting bracket is connected to the box body through a movable mechanism, and when the vacuum chamber rotates relative to the fixed rod, the powder tank will be displaced up and down relative to the vacuum chamber, the fixed rod and the connecting bracket to vibrate the powders in the box body.

9. The vibrating deposition device according to claim 8, wherein the movable mechanism includes a groove, and the box body includes a connecting unit disposes in the groove.

10. The vibration deposition device according to claim 1, wherein the protruding unit of the powder tank is a wheel.

11. The vibratory deposition device according to claim 2, wherein the shaft sealing device is connected to the first base, and the fixed rod is connected to the first base via a bearing.

12. A vibrating deposition device, comprising:
 a vacuum chamber comprising an inner side surface, a first base and a second base, wherein the first base and the second base are respectively disposed two sides of the inner side surface forming a reaction space;
 a fixed rod located in the of the reaction space of the vacuum chamber, wherein the vacuum chamber is rotatable relative to the fixed rod;
 a powder tank located in the reaction space of the vacuum chamber, and comprising:
  a box body for accommodating powders, and connected to the fixed rod through a connecting bracket; and
  at least one rotating wheel connected to the box body, and at least one bulge arranged on a surface of the rotating wheel, wherein the rotating wheel contacts the inner side surface of the vacuum chamber, when the vacuum chamber rotates relative to the fixed rod, the rotating wheel will rotate relative to the box body and the inner side surface of the vacuum chamber, so that the powder tank will be displaced up and down relative to the vacuum chamber to vibrate the powders in the box body.

13. The vibrating deposition device according to claim 12, further comprising a shaft sealing device including an outer tube and an inner tube, wherein the outer tube has an accommodation space for accommodating the inner tube, wherein the outer tube is connected to the vacuum chamber, and the inner tube is connected to the fixed rod.

14. The vibrating deposition device according to claim 13, further comprising a motor connecting to and driving the vacuum chamber to rotate relative to the inner tube, the fixed rod and the powder tank through the outer tube of the shaft sealing device.

15. The vibratory deposition device according to claim 12, further comprising:
- an intake line located within the inner tube, and fluidly connected to the reaction space of the vacuum chamber for delivering a precursor to the reaction space; and
- an extraction line located within the inner tube, and fluidly connected to the reaction space of the vacuum chamber for extracting a gas in the reaction space.

16. The vibration deposition device according to claim 12, wherein the shaft sealing device is connected to the first base, and the second base is made of a light-transmitting material.

17. The vibration deposition device according to claim 16, further comprising a heating lamp adjacent to the second base to heat the powder tank and the powders within the reaction space of the vacuum chamber via the second base, wherein the inner side surface and the first base are used to reflect a light from the heating lamp entering the reaction space through the second base.

18. The vibration deposition apparatus according to claim 12, further comprising a heater located outside the vacuum chamber, adjacent to a part of the inner side surface of the vacuum chamber to heat the powder tank and the powders within the reaction space of the vacuum chamber.

19. The vibrating deposition device according to claim 12, wherein the connecting bracket is connected to the box body through a movable mechanism, and when the vacuum chamber rotates relative to the fixed rod, the powder tank will be displaced up and down relative to the vacuum chamber, the fixed rod and the connecting bracket to vibrate the powders in the box body.

20. The vibratory deposition device according to claim 12, wherein the inner side surface of the vacuum chamber is a rough surface.

\* \* \* \* \*